United States Patent
Gao et al.

[11] Patent Number: 5,514,414
[45] Date of Patent: May 7, 1996

[54] SOLVENT-LESS VAPOR DEPOSITION APPARATUS AND PROCESS FOR APPLICATION OF SOLDERING FLUXES

[75] Inventors: Guilian Gao, Novi; Peter J. Sinkunas, Canton; Brenda J. Nation, Bloomfield Hill; Myron Lemecha, Dearborn; Lawrence Kneisel, Novi, all of Mich.

[73] Assignee: Ford Motor Company, Dearborn, Mich.

[21] Appl. No.: 343,072

[22] Filed: Nov. 21, 1994

[51] Int. Cl.⁶ .................................................. C23C 14/00
[52] U.S. Cl. ...................... 427/255.6; 118/724; 118/725; 118/726
[58] Field of Search .................................. 118/724, 725, 118/726; 427/255.6

[56] References Cited

U.S. PATENT DOCUMENTS

| | | | |
|---|---|---|---|
| 4,055,217 | 10/1977 | Chu et al. | 165/1 |
| 4,090,843 | 5/1978 | Chu et al. | 432/197 |
| 4,264,642 | 4/1981 | Ferralli | 427/38 |
| 4,800,105 | 1/1989 | Nakayama et al. | 427/253 |
| 4,821,948 | 4/1989 | Fisher et al. | 228/223 |
| 4,871,105 | 10/1989 | Fisher et al. | 228/33 |
| 4,921,723 | 5/1990 | Nichols et al. | 427/41 |
| 5,024,856 | 6/1991 | Hohnerlein | 427/57 |
| 5,164,022 | 11/1992 | Pine et al. | 148/23 |
| 5,281,281 | 1/1994 | Stefanowski | 148/23 |

Primary Examiner—Richard Bueker
Attorney, Agent, or Firm—Joseph W. Malleck; Roger L. May

[57] ABSTRACT

Apparatus and method for condensing a solderless flux vapor onto a work surface to be soldered, such as an electronic circuit board. The flux vapor is created by heating flux in a liquid state to a temperature greater than the temperature of the work surface. Flux is applied to the work surface without the use of any volatile organic chemicals.

20 Claims, 1 Drawing Sheet

SOLVENT-LESS VAPOR DEPOSITION APPARATUS AND PROCESS FOR APPLICATION OF SOLDERING FLUXES

FIELD OF THE INVENTION

This invention is directed to the application of soldering fluxes and more particularly relates a method and apparatus for condensing a solderless flux vapor onto a work surface to be soldered, such as an electronic circuit board.

BACKGROUND OF THE INVENTION

In the past, there have been attempts to use gaseous fluxes, such as formic acid and gaseous hydrazine for soldering of electronic circuit boards. Such gaseous fluxes are highly volatile at or near the ambient temperature and are introduced into the environment for the soldering process as gases. Such gaseous fluxes are difficult to contain in a wave soldering machine and are less effective than conventional liquid fluxes in cleaning oxide and promoting wetting. After the soldering operation, most of the gaseous flux is emitted as hazardous chemicals. Moreover, gaseous fluxes tend to leave corrosive residue which requires post-soldering cleaning.

There have been attempts to apply a flux to a work surface while avoiding volatile organic chemicals (VOCs) in the past. For example, U.S. Pat. No. 5,281,281 (Stefanowski, filed Feb. 5, 1993) suggests that the flux be dissolved in a water solvent that also includes a surfactant. The dissolved flux in water may be applied by wave, foaming or spraying. However, without cleaning or coating, the use of fluxes dissolved in water degrades product reliability. The addition of a cleaning procedure or coating requires additional floor space, longer production cycle time and higher costs.

U.S. Pat. No. 5,164,022 (Pine et al., filed Feb. 19, 1991) discloses the heating of a liquid flux in a chamber until the flux vaporizes which forces droplets of the flux out of holes in a reservoir and onto a work surface.

U.S. Pat. No. 5,024,856 (Hohnerlein, filed Dec. 29, 1989) discloses the application of droplets of flux produced by an ultrasonic atomizer to a work surface.

U.S. Pat. No. 4,821,948 (Fisher et al., filed Apr. 6, 1988) and U.S. Pat. No. 4,871,105 (Fisher et al., filed Feb. 1, 1989) disclose flux droplets that are injected into a gas stream directed against a circuit board to be soldered.

With the exception of U.S. Pat. No. 5,281,281, the foregoing prior art does not disclose a way of avoiding VOCs. U.S. Pat. No. 5,281,281 is limited in the amount of flux that can be applied to a work surface because the flux must be dissolved in a substantial amount of water and a surfactant also is necessary.

SUMMARY OF THE INVENTION

The applicants have discovered that VOCs can be avoided and strong solder joints can be conveniently created by providing a solventless source of flux in a liquid phase in a flux reservoir from a solid or liquid flux stable at the ambient temperature. In the event that a solid flux is used, it is heated to place the flux in a liquid phase. The liquid phase of the flux is then heated to create a flux vapor in a flux application zone. The flux vapors are at a temperature greater than the temperature of the work surface on which the soldering is to take place. The work surface is then passed through the application zone so that the flux vapor condenses on the work surface. By using the foregoing technique, concentrated amounts of flux can be applied to a work surface without use of any VOCs.

Additional features and advantages of the invention will be more apparent from the following detailed discussion of certain preferred embodiments.

BRIEF DESCRIPTION OF DRAWING

The detailed description of certain preferred embodiments of the invention is provided below with reference to the accompanying drawing labeled FIG. 1 which is a schematic cross-sectional view of a preferred form of flux chamber and related apparatus made in accordance with a preferred embodiment of the invention.

DETAILED DESCRIPTION OF CERTAIN PREFERRED EMBODIMENTS

Figure 1:
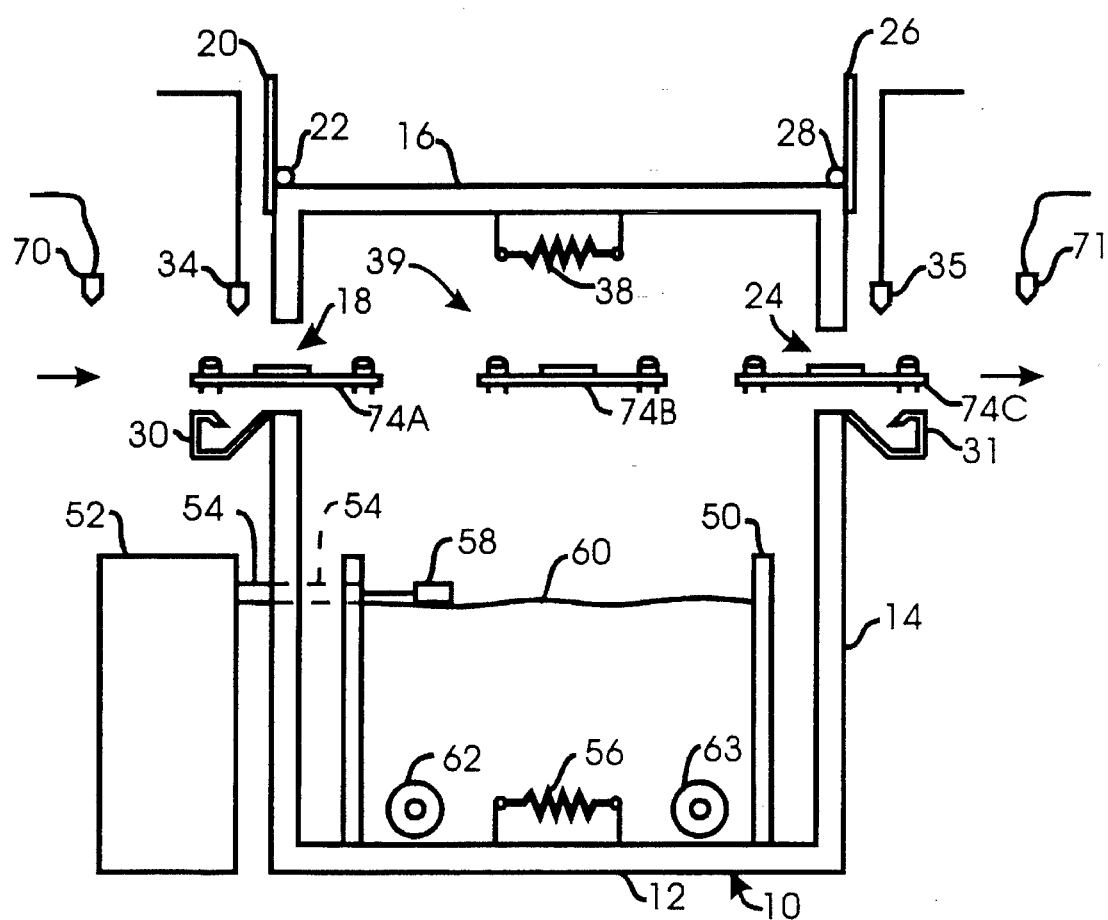

Referring to FIG. 1, a preferred form of apparatus made in accordance with the present invention comprises a stainless steel chamber 10 having a bottom 12, a heated wall 14 and a top 16. Stainless steel is used in chamber 10 in order to prevent corrosion by flux liquid. However, other materials that also would not be corroded by flux liquid could be substituted in place of stainless steel. Wall 14 and top 16 are heated in order to prevent solidification of flux on the wall.

Chamber 10 is fitted with an inlet opening 18 that may be closed by sliding door controlled by a motor 22. Chamber 10 also is fitted with an outlet opening 24 that may be closed by a sliding door 26 controlled by a motor 28. Condensation traps 30 and 31 are placed adjacent openings 18 and 24, respectively, to collect flux vapor that may tend to escape through the openings. Nitrogen knives 34 and 35 located adjacent openings 18 and 24 in the positions shown cooperate with the condensation traps in order to collect flux vapor. Use of nitrogen knives and condensation traps of the type illustrated in FIG. 1 are well known in the art and need not be described in detail.

Chamber 10 includes a top heater 38 that helps maintain the density of flux vapor in an application zone 39 which extends through chamber 10 from opening 18 to opening 24.

Chamber 10 also includes a stainless steel reservoir 50 that receives solid or liquid flux from an external tank 52 through a conventional passageway 54. Reservoir 50 includes a reservoir heater 56 that melts solid flux and places it into a liquid state. Heater 56 also evaporates flux from a liquid state in order to create a flux vapor in the upper portion of chamber 10 in general and in application zone 39 in particular. Reservoir 50 is fitted with a conventional float control 58 that floats on a top surface 60 of liquid phase flux. Inert gas aerator jets 62 and 63 are located in reservoir 50 in order to supply inert gas to flux in the liquid phase in reservoir 50. The inert gas, such as nitrogen, is supplied from a source that is not shown.

Motion sensors 70 and 71 detect the presence of a work surface to be soldered, such as a circuit board 74. The figures labeled 74A–74C indicate circuit board 74 in various positions as it proceeds through chamber 10.

The basic flux application process carried out in chamber 10 uses a flux that is stable in solid or liquid form at ambient temperature. If solid flux is provided, the solid flux is heated by heater 56 into a liquid phase. The liquid phase of flux is vaporized by additional heating by heater 56 that may comprise a conventional electric heater, infrared heating, microwave heating, or other suitable means for vaporizing the liquid phase of flux. The vaporized flux is allowed to condense or solidify onto a work surface to be soldered, such as electronic circuit board 74, prior to soldering. No solvent or other additive is needed for the process. Once deposited, the flux will remain on the work surface in solid or liquid form. The flux can be any material with the power of cleaning oxide and promoting wetting. The flux itself should not decompose in a temperature range where significant evaporation rate can be obtained by heating. The process can be used to deposit no-clean fluxes, as well as fluxes which require post-solder cleaning. No-clean fluxes refer to fluxes which do not require post-solder cleaning.

Fluxes applicable to the preferred embodiments include, but are not limited to, di-basic acids, such as adipic acid, malonic acid, maleic acid, glutaric acid, pimelic acid and the like, as well as mono-basic acids, such as valeric acid, caproic acid, enanthic acid, capric acid, myristic acid, palmitic acid, stearic acid and the like.

A process in accordance with the present invention enhances solder processing performance and solder quality due to more uniform flux deposition, better penetration of flux into the through-holes of circuit board 74, and deposition of fluxes on both sides of a work surface, if required. It also results in reduced costs.

Referring to FIG. 1, a preferred form of process in accordance with the present invention begins when inlet sensor 70 detects the presence of circuit board 74 moving toward opening 18. In response to the detection, motor 22 causes sliding door 20 to raise, thereby allowing circuit board 74 to enter opening 18 in the position 74A. When door 20 opens, nitrogen knife 34 and condensation trap 30 are activated, thereby inhibiting the escape of flux vapor to the atmosphere. Circuit board 74 then continues to move to the right to position 74B in application zone 39.

In zone 39, flux vapor, such as adipic acid vapor, deposits on the cooler surface of circuit board 74. In the event only one side of the board is to be soldered, the opposite side of the board may be covered in order to prevent the deposition of flux vapor. The amount of vapor in zone 39 may be controlled by adjusting the heat produced by heater 56 and the amount of inert gas sent through nozzles 62 and 63 into the liquid phase of the flux contained in reservoir 50.

After flux vapor has condensed on circuit board 74 in position 74B, motor 28 causes door 26 to raise so that circuit board 74 can continue to position 74C. The board thereafter continues to the right, as shown in FIG. 1, where it is detected by outlet sensor 71, thereby causing motor 28 to close door 26. When door 26 opens, nitrogen knife 35 and condensation trap 31 are activated, thereby inhibiting the escape of flux vapor to the atmosphere.

The inert gas introduced through nozzles 62 and 63 is preheated in order to enhance flux vaporization. The gas also provides in application zone 39 an inert environment to prevent oxidation and decomposition of the flux.

When level 60 of flux in the liquid phase is sufficiently reduced, float control 58 causes the introduction of additional solid or liquid flux into reservoir 50 through passageway 54 by conventional means.

Compared to conventional fluxing technologies, the apparatus and method described in this specification provide more uniform deposition of flux, better penetration into the through-holes of board 74 and deposition on both sides of board 74 at the same time. As a result, it enhances the manufacturing process capability and product quality through improved solderability. It also may be possible to eliminate the hot air solder leveling process for some applications.

The various preferred embodiments of the invention described in detail above are intended only to be illustrative of the invention. Those skilled in the art will recognize that modifications, additions and substitutions can be made in the various features and elements of the invention without departing from the true spirit and scope of the invention. The following claims are intended to cover the true scope and spirit of the invention.

What we claim is:

1. A process for applying flux to a solder work surface having a predetermined temperature comprising in combination the steps of:

providing a solventless source of flux in a liquid phase in a flux reservoir from a solid or liquid flux stable at ambient temperature;

creating a flux vapor in a flux application zone by heating said flux in said flux reservoir, said flux vapor being at a temperature greater than said predetermined temperature;

passing said work surface through said application zone, so that said flux vapor condenses on said work surface, whereby flux is applied to said work surface without the use of any volatile organic chemicals.

2. A process, as claimed in claim 1, wherein said flux is selected from the group consisting of di-basic acids and mono-basic acids.

3. A process, as claimed in claim 2, wherein said di-basic acids are selected from the group consisting of adipic acid, malonic acid, maleic acid, glutaric acid, pimelic acid.

4. A process, as claimed in claim 2, wherein said mono-basic acids are selected from the group consisting of valeric acid, caproic acid, enanthic acid, capric acid, myristic acid, palmitic acid, and stearic acid.

5. A process, as claimed in claim 1, wherein said step of providing a solventless source of flux in a liquid phase comprises the step of melting any solid flux in said flux reservoir.

6. A process, as claimed in claim 5, wherein said step of providing comprises the step of introducing an inert gas into said liquid phase of said flux in said reservoir.

7. A process, as claimed in claim 6, wherein said step of creating a vapor flux comprises the step of controlling the rate of evaporation of said flux by controlling the amount of said heating and the amount of said inert gas introduced into said reservoir.

8. A process, as claimed in claim 1, wherein said step of providing a solventless source of flux comprises the step of heating the walls of said reservoir to prevent solidification of said flux on the walls of said reservoir.

9. A process, as claimed in claim 1, wherein said step of passing said work surface through said application zone comprises the steps of:

enclosing said application zone to contain said flux vapor;

opening said application zone to admit said work surface;

closing said application zone after said work surface is in said application zone;

opening said application zone to allow the exit of said soldered work surface; and closing said application zone after the exit of said soldered work surface.

10. Apparatus for applying flux to a solder work surface having a predetermined temperature comprising in combination:

means for providing a solventless source of flux in a liquid phase in a flux reservoir from a solid or liquid flux stable at ambient temperature;

means for creating a flux vapor in a flux application zone by heating said flux in said flux reservoir, said flux vapor being at a temperature greater than said predetermined temperature; and means for passing said work surface through said application zone, so that said flux vapor condenses on said work surface, whereby flux is applied to said work surface without the use of any volatile organic chemicals.

11. Apparatus, as claimed in claim 10, wherein said flux is selected from the group consisting of di-basic acids and mono-basic acids.

12. Apparatus as claimed in claim 11, wherein said di-basic acids are selected from the group consisting of adipic acid, malonic acid, maleic acid, glutaric acid, pimelic acid.

13. Apparatus, as claimed in claim 11, wherein said mono-basic acids are selected from the group consisting of valeric acid, caproic acid, enanthic acid, capric acid, myristic acid, palmitic acid, and stearic acid.

14. Apparatus, as claimed in claim 10, wherein said means for providing a solventless source of flux in a liquid phase comprises means for melting any solid flux in said flux reservoir.

15. Apparatus, as claimed in claim 14, wherein said means for providing comprises means for introducing an inert gas into said liquid phase of said flux in said reservoir.

16. Apparatus, as claimed in claim 15, wherein said means for creating a vapor flux comprises means for controlling the rate of evaporation of said flux by controlling the amount of said heating and the amount of said inert gas introduced into said reservoir.

17. Apparatus, as claimed in claim 10, wherein said means for providing a solventless source of flux comprises means for heating the walls of said reservoir to prevent solidification of said flux on the walls of said reservoir.

18. Apparatus, as claimed in claim 10, wherein said means for passing said work surface through said application zone comprises:

means for enclosing said application zone to contain said flux vapor;

first means for opening said application zone to admit said work surface and for closing said application zone after said work surface is in said application zone; and second means for opening said application zone to allow the exit of said soldered work surface and for closing said application zone after the exit of said soldered work surface.

19. Apparatus, as claimed in claim 18, and further comprising means for trapping said flux vapor outside said first means and said second means.

20. Apparatus, as claimed in claim 10, and further comprising means for maintaining a predetermined level of said flux in said reservoir.

* * * * *